United States Patent
Murakami (10) Patent No.: US 7,613,022 B2
(45) Date of Patent: Nov. 3, 2009

(54) SEMICONDUCTOR MEMORY DEVICE AND METHOD OF FORMING THE SAME

(75) Inventor: Hiroki Murakami, Yokohama (JP)

(73) Assignee: Samsung Electronics Co., Ltd, Gyeonggi-Do (KR)

( * ) Notice: Subject to any disclaimer, the term of this patent is extended or adjusted under 35 U.S.C. 154(b) by 184 days.

(21) Appl. No.: 11/819,174

(22) Filed: Jun. 26, 2007

(65) Prior Publication Data

US 2007/0295999 A1 Dec. 27, 2007

(30) Foreign Application Priority Data

Jun. 26, 2006 (JP) ............................. 2006-175551

(51) Int. Cl.
*G11C 5/06* (2006.01)
(52) U.S. Cl. .......................................... 365/63; 365/72
(58) Field of Classification Search .................... 365/67, 365/70, 75
See application file for complete search history.

(56) References Cited

U.S. PATENT DOCUMENTS 5,671,173 A * 9/1997 Tomita .......................... 365/63

FOREIGN PATENT DOCUMENTS

| KR | 10-1999-0045010 A | 6/1999 |
| KR | 10-2002-0078432 A | 10/2002 |
| KR | 10-2007-0038233 A | 4/2007 |

* cited by examiner

*Primary Examiner*—Tan T. Nguyen
(74) *Attorney, Agent, or Firm*—Harness, Dickey & Pierce, P.L.C.

(57) ABSTRACT

Example embodiments provide a semiconductor memory device and method of forming a semiconductor memory device that may equalize load due to a coupling capacitance between a line and a component signal when the line intersects the component signal in a memory cell array. A line may intersect a memory cell region between a transmitting point (A) and a receiving point (B) of a signal. A line between the transmitting point (A) and the receiving point (B) may be bent at two portions of each of bit lines. Because areas where the line and the bit lines extend parallel to each other may be equal in dimension at each bit line, coupling capacitances between the line and the bit lines may be equalized. The read characteristic may not be affected by the coupling capacitances.

14 Claims, 8 Drawing Sheets

Fig. 1

(CONVENTIONAL ART)

(a)

Typical Case

(b)

Reduction

Fig. 2

(CONVENTIONAL ART)

Fig. 3

(CONVENTIONAL ART)

(CONVENTIONAL ART)

(a)

(b)

SEMICONDUCTOR MEMORY DEVICE AND METHOD OF FORMING THE SAME

PRIORITY STATEMENT

This U.S. non-provisional patent application claims priority under 35 U.S.C. § 119 of Japanese Patent Application No. 2006-175551 filed on Jun. 26, 2006, the entire contents of which are hereby incorporated by reference.

BACKGROUND

1. Field

Example embodiment relate to a semiconductor memory device and method of forming a semiconductor memory device, for example, to a semiconductor memory device capable of equalizing load of a coupling capacitance between a line and a component in a memory cell array when the line intersects the component.

2. Description of Related Art

Figure 3:
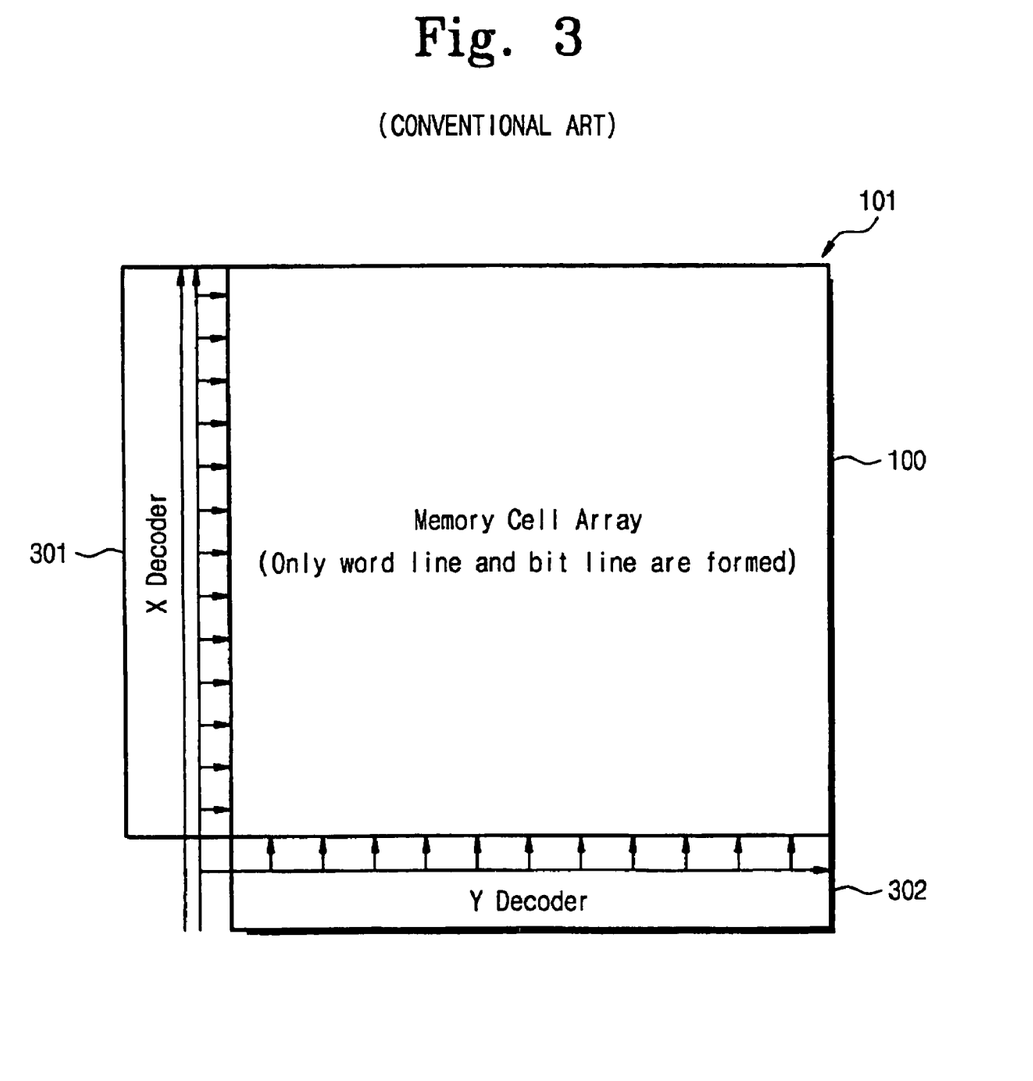
FIG. 3 is a schematic view of a conventional memory cell array in a semiconductor memory device.

FIG. 3 is a schematic view of a memory cell array 100 in a semiconductor memory device. The memory cell array 100 may include a plurality of memory cells (not shown) disposed in a matrix form, and a plurality of word lines and bit lines may be disposed in the memory cell array 100. A word line and a bit line may be selected by outputs of an X decoder 301 and a Y decoder 302, and a memory cell located at intersection therebetween may be selected.

Figure 1:
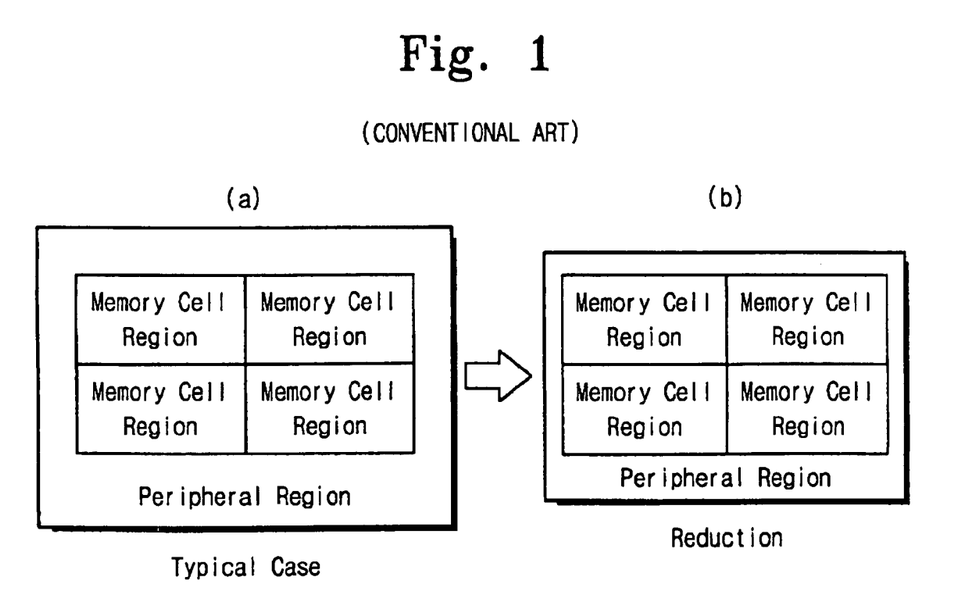
FIG. 1A is a schematic view illustrating a conventional memory cell region and a peripheral region.
FIG. 1B is a schematic view illustrating a conventional reduced memory cell region and a reduced peripheral region.

A memory region with a memory cell array may be decreased as the size of a memory cell becomes smaller. FIG. 1A illustrates a memory cell region and a peripheral region and FIG. 1B illustrates a reduced memory cell region and a reduced peripheral region. As illustrated in FIGS. 1A and 1B, the degree of reduction of the peripheral region is relatively small, when compared with the degree of reduction of the memory cell region. The reason is that the size of a circuit and the number of signal lines increases as a semiconductor device with higher performance and/or lower power consumption may be required.

Figure 2:
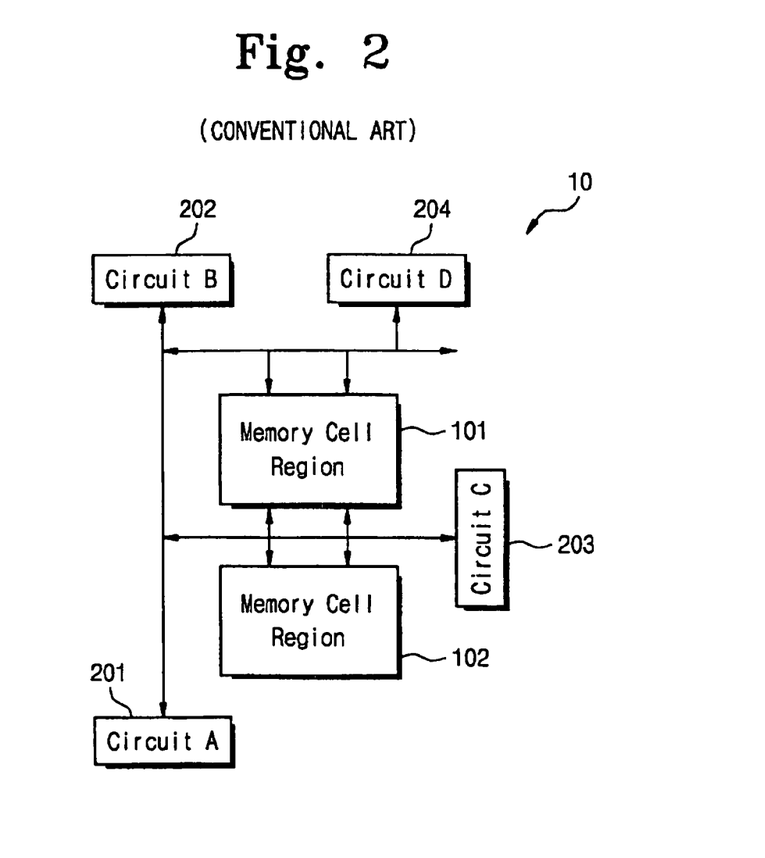
FIG. 2 is a block diagram of a conventional semiconductor chip.

Referring to FIG. 2, a semiconductor chip 10 may include, for example, memory cell regions 101 and 102 and peripheral circuits 201, 202, 203 and 204. When a signal used for each peripheral circuit is not synchronized with an operation of a memory cell, this may affect a word line or a bit line, and thus only the word line and the bit line may be formed in the memory cell region 101 and other signal lines may not be formed.

Figure 4:
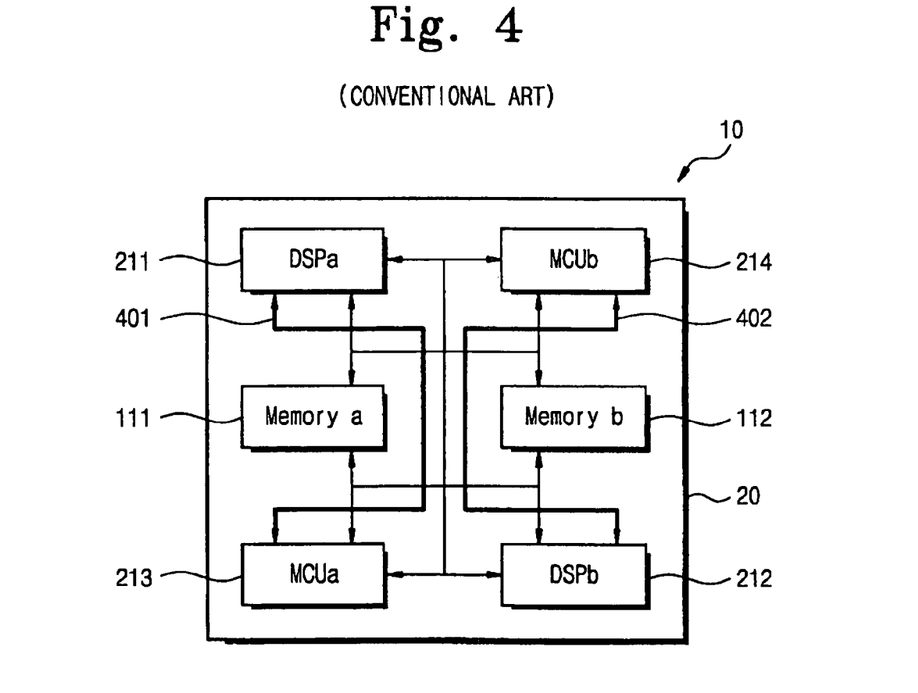
FIG. 4 is a block diagram illustrating conventional lines in a semiconductor chip.

Lines between the peripheral circuits 201, 202, 203 and 204 may be formed such that the lines do not pass over the memory cell regions 101 and 102. Referring to FIG. 4, digital signal processors (DSPs) 211 and 212 and memory control units (MCUs) 213 and 214 are exemplarily illustrated as peripheral circuits in a chip 20.

Even though the DSPa 211 and the MCUa 213 are disposed to interpose a memory a 111 (for example, a flash memory) therebetween, a line connecting them may not pass over and detours around the memory a 111. Similarly, even though the DSPb 212 and the MCUb 214 may be disposed to interpose a memory b 112 (for example, a flash memory) therebetween, a line connecting them may not pass over and detours around the memory b 112. In FIG. 4, these lines are represented by relatively thick arrows 401 and 402.

When lines are formed so as to detour memory cell regions without passing over them, a line region of a peripheral region may increase according to an increase in the number of signals. Therefore, it may be difficult to reduce the peripheral region around the memory cell regions.

Figure 5:
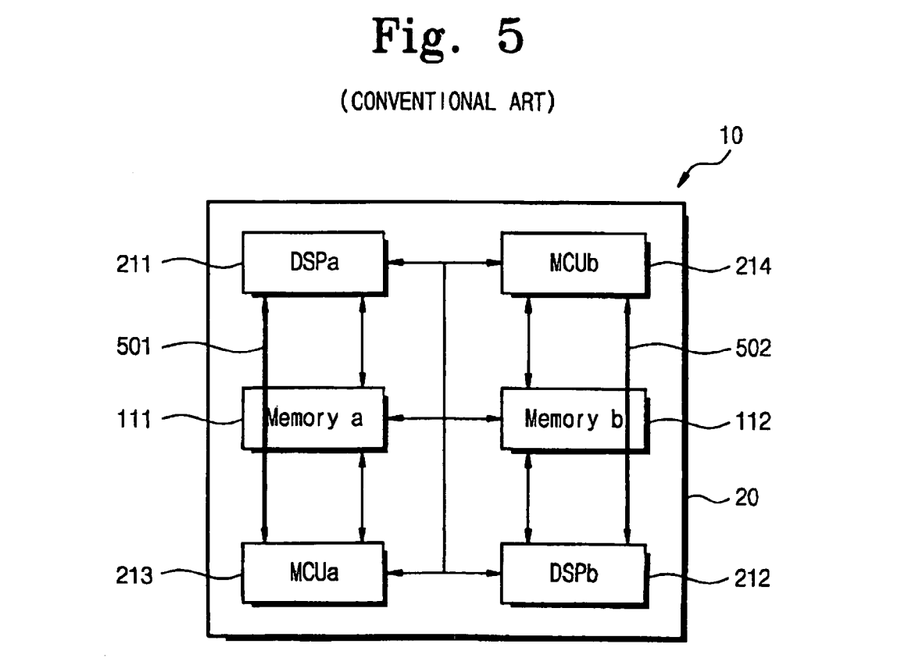
FIG. 5 is a block diagram illustrating other conventional lines in a semiconductor chip.

Reduction of a die size may be essential to a general-purpose memory. Also, a signal line may need to be formed in a memory cell of a peripheral circuit. For example, as described above, when memories (for example, flash memories) and MCUs are mounted in the same chip, signal lines may be formed as well as word lines and/or bit lines in a memory cell, as lines 501 and 502 are illustrated in FIG. 5. In FIG. 5, the line 501 intersects a memory 111 to connect a DSPa 211 with a MCUa 213 and the line 502 intersects a memory 112 to connect a DSPb 212 with a MCUb 214 on a chip 20. In this case, lines may be formed as illustrated in FIGS. 10A and 10B.

Figure 10:
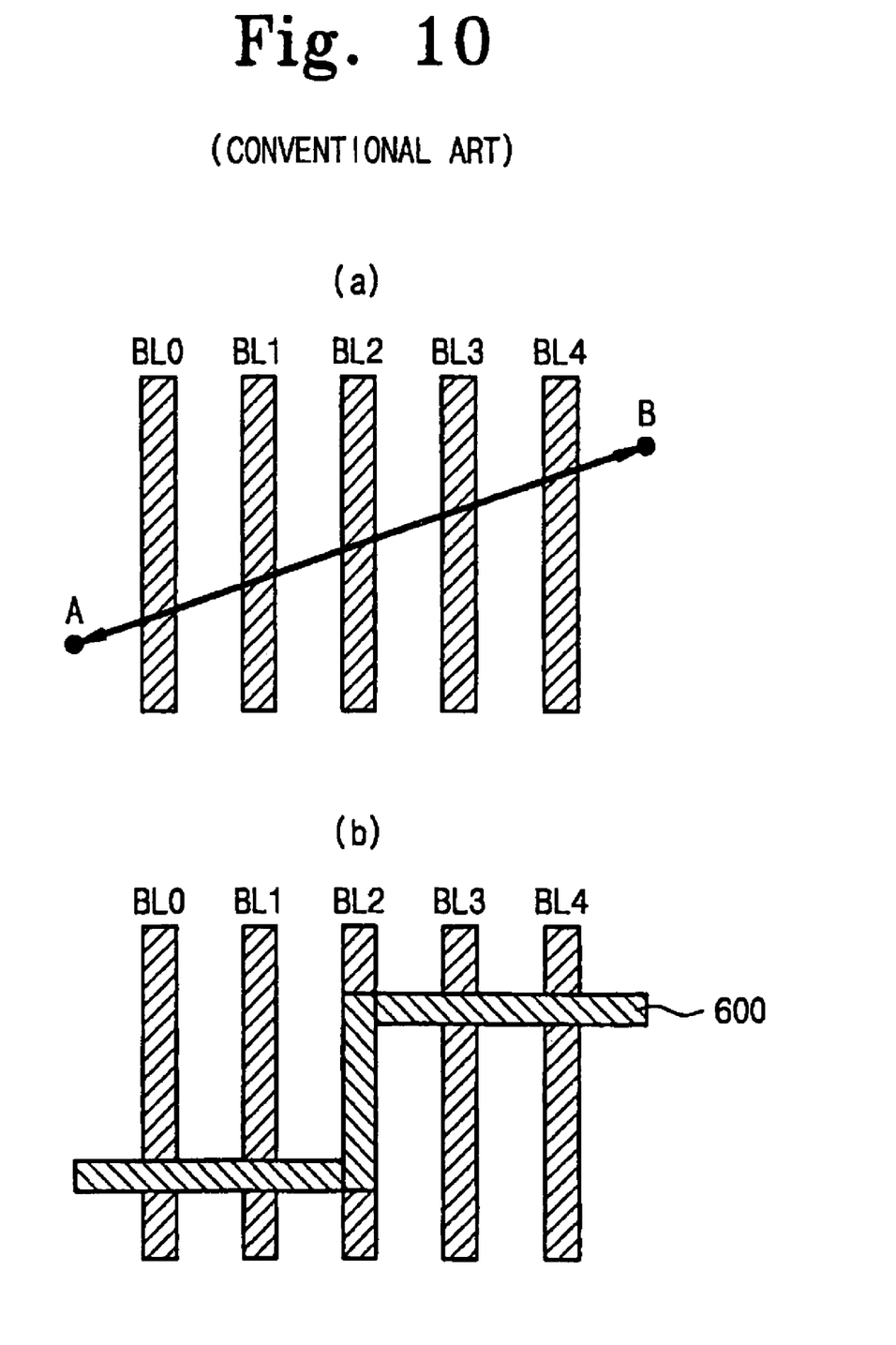
FIG. 10A is a view illustrating bit lines and a transmitting point and a receiving point of a signal connected by a conventional line that intersects the bit lines.
FIG. 10B is a view illustrating a conventional line.

For example, when a transmitting point A and a receiving point B of a signal are located as illustrated in FIG. 10A, an A-B line 600 between the transmitting point A and the receiving point B may be at right angles to bit lines BL0-BL2, is bent at two portions of a bit line BL2, and is at right angles to bit lines BL2-BL4, as illustrated in FIG. 10B.

In a memory cell array, the bit line BL2 corresponding to a lower one of bent portions of the line 600 may be affected by load of coupling capacitance between the line 600 and the bit lines BL0~BL4. Therefore, coupling capacitances of the bit lines BL0~BL4 are represented as follows: BL0, BL4<BL1, BL3<BL2.

In a semiconductor memory device, the read access speed should be considered, based on a line that is most affected by load of a coupling capacitance, e.g., a line with the slowest read access speed. Therefore, in FIGS. 10A and 10B, the read access speed may be determined based on the bit line BL2 that has the largest coupling capacitance. That is, the read characteristic may be deteriorated due to biased coupling capacitance in the bit lines.

As shown in FIG. 10B and discussed above, when coupling capacitances between adjoining word lines or bit lines are not uniform, it may become difficult to accurately operate the semiconductor memory device.

SUMMARY OF THE INVENTION

Example embodiments provide a semiconductor memory device that may save a line region.

Example embodiments provide a semiconductor memory device that may prevent or reduce line congestion and signal delay when the number of signal lines increases.

Example embodiments provide a semiconductor memory device including a line between a transmitting point A and a receiving point B which equalizes a coupling capacitance.

Example embodiments provide a semiconductor memory device that may reduce or minimize effects on the read characteristic by equalizing load due to coupling capacitances between a line and bit lines in a memory.

Example embodiments provide semiconductor memory devices that equalize overlap between a line and bit lines in a memory.

Example embodiments provide semiconductor memory devices including: a memory cell array including a plurality of word lines, a plurality of bit lines, and a plurality of memory cells arranged at intersections of the word lines and the bit lines in a matrix form; and/or a line crossing a memory cell region provided with the plurality of memory cell to connect first and second peripheral circuits disposed in a peripheral region of the memory region to each other. Coupling capacitance between the line and each of the plurality of bit lines may be uniform.

In example embodiments, the line may include a plurality of bent portions at each of the bit lines and areas where the line and the bit lines extend parallel to each other may be equal in dimension at each bit line.

In example embodiments, the total number of the bent portions may be more than an integer multiple of the total number of the bit lines.

In example embodiments, the line may extend linearly between the first and second peripheral circuits in the memory cell region.

Example embodiments provide methods of forming a semiconductor memory device including providing a memory cell array defining a memory cell region, including a plurality of word lines, a plurality of bit lines, and a plurality of memory cells arranged at intersections of the plurality of word lines and the plurality of bit lines in a matrix form and forming a line, crossing the memory cell region, to connect first and second peripheral circuits, disposed in a peripheral region, to each other, wherein a coupling capacitance between the line and each of the plurality of bit lines is equalized.

BRIEF DESCRIPTION OF THE FIGURES

The accompanying figures are included to provide a further understanding of example embodiments, and are incorporated in and constitute a part of this specification. The drawings illustrate example embodiments and, together with the description, serve to explain example principles. In the figures.

DETAILED DESCRIPTION OF EXAMPLE EMBODIMENTS

Example embodiments will be more clearly understood from the detailed description taken in conjunction with the accompanying drawings.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Also, the use of the words "compound," "compounds," or "compound(s)," refer to either a single compound or to a plurality of compounds. These words are used to denote one or more compounds but may also just indicate a single compound.

Various embodiments of the present invention will be described in detail with reference to the attached drawings. However, example embodiments are not limited to the example embodiments, but may be embodied in various forms. In the figures, if a layer is formed on another layer or a substrate, it means that the layer is directly formed on another layer or a substrate, or that a third layer is interposed therebetween. In the following description, the same reference numerals denote the same elements.

Although example embodiments have been disclosed for illustrative purposes, those skilled in the art will appreciate that various modifications, additions and substitutions are possible, without departing from the scope and spirit of the invention as disclosed in the accompanying claims.

Example embodiments will be described below in more detail with reference to the accompanying drawings.

Figure 6:
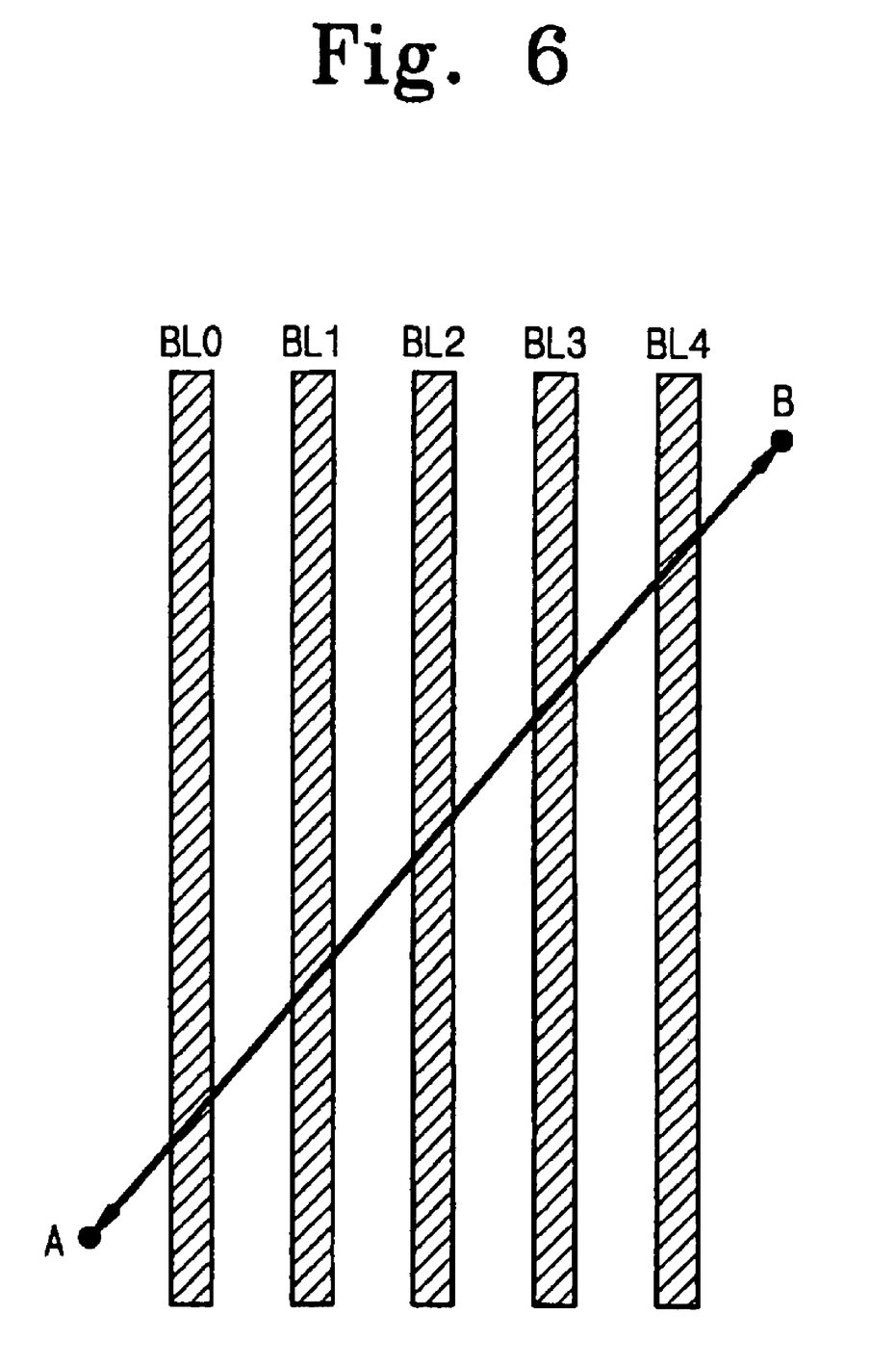
FIG. 6 is a view illustrating bit lines and a transmitting point and a receiving point of a signal connected by a line that intersects the bit lines according to example embodiments.

To begin with, an example embodiment will be described. FIG. 6 illustrates a transmitting point A and a receiving point B of a signal to be connected with a plurality of bit lines BL0~BL4 in an example embodiment.

Figure 7:
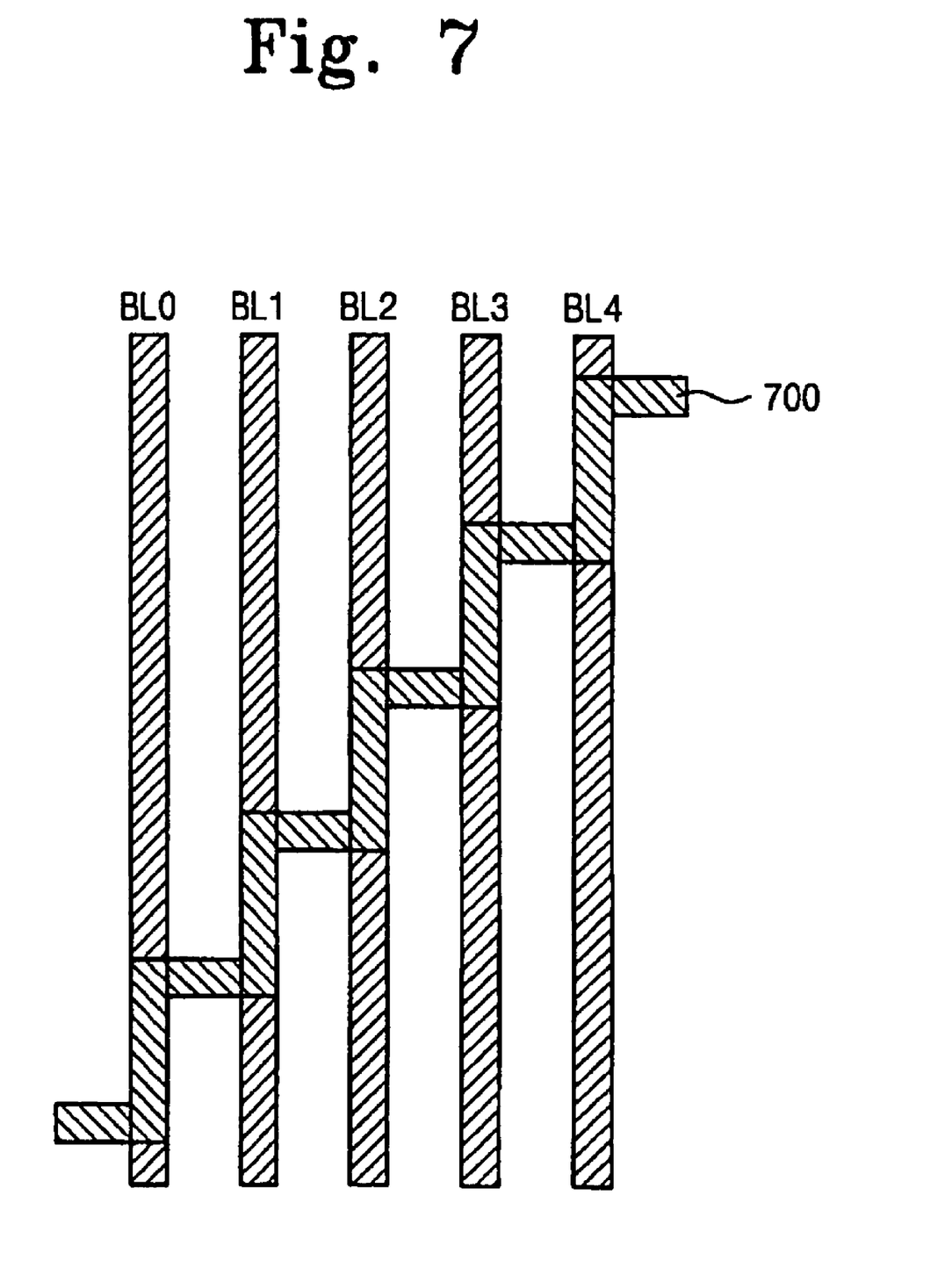
FIG. 7 is a view illustrating an example embodiment.

As illustrated in FIG. 7, in an example embodiment, a line 700 between the transmitting and receiving points A and B may be bent at two portions (for example, in a step-wise pattern) of each of the bit lines BL0~BL4. Because areas where the line 700 extends parallel to the bit lines BL0~BL4 may be equal to each other in dimension, coupling capacitances between the line 700 and each of the bit lines BL0~BL4 may be equalized. The read access speed may not decrease in any bit line, and the coupling capacitances may not affect the read characteristic.

Figure 8:
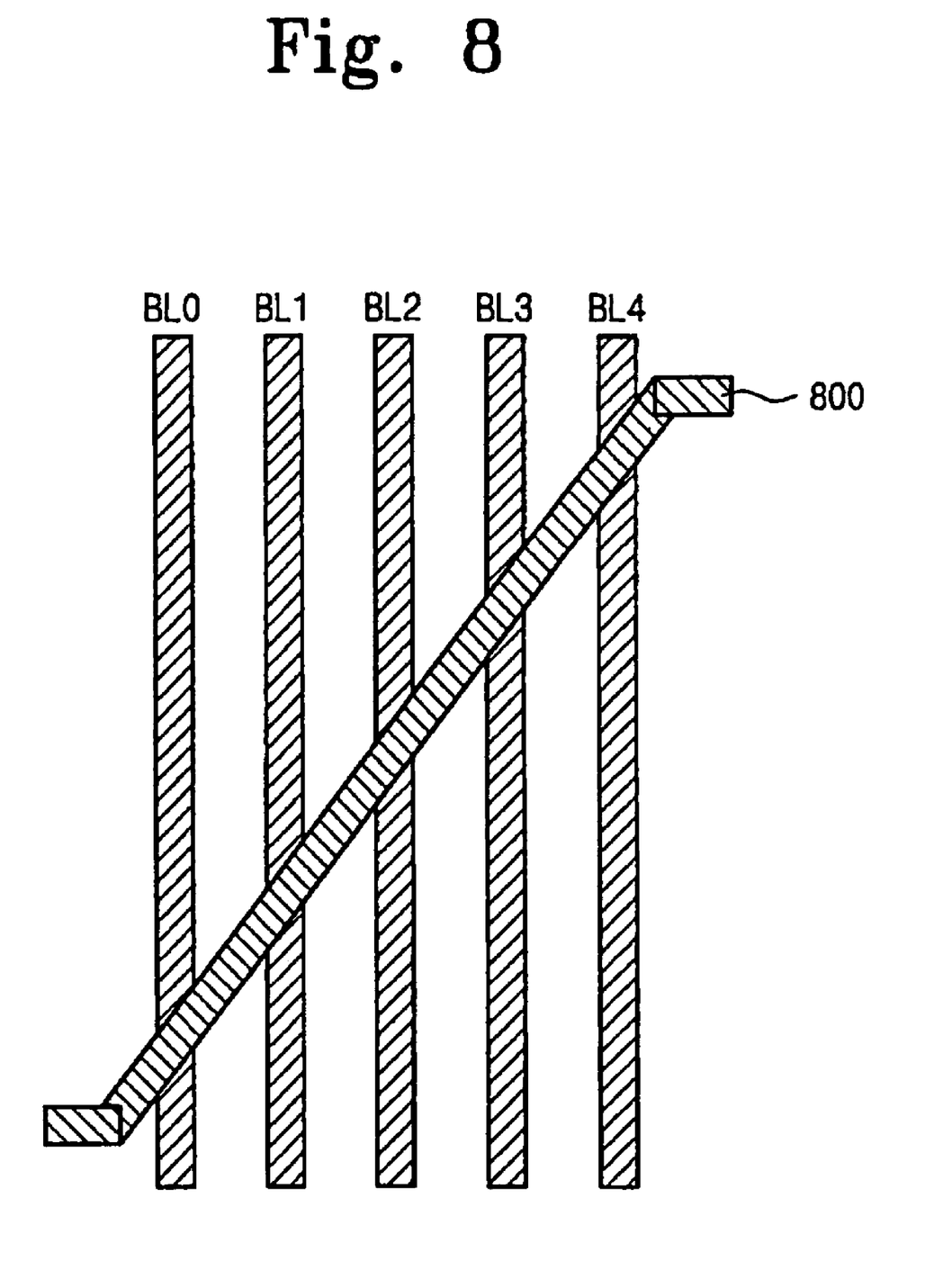
FIG. 8 is a view illustrating an example embodiment.

An example embodiment is illustrated in FIG. 8. A line 800 is formed between the transmitting point A and the receiving point B of a signal illustrated in FIG. 6.

In an example embodiment, the line 800 between the transmitting point A and the receiving point B may extend straight without being bent at any of bit lines BL0~BL4. Load due to coupling capacitances between the line 800 and the bit lines BL0~BL4 may be equalized, and thus the read characteristic may not be affected by the coupling capacitances.

Figure 9:
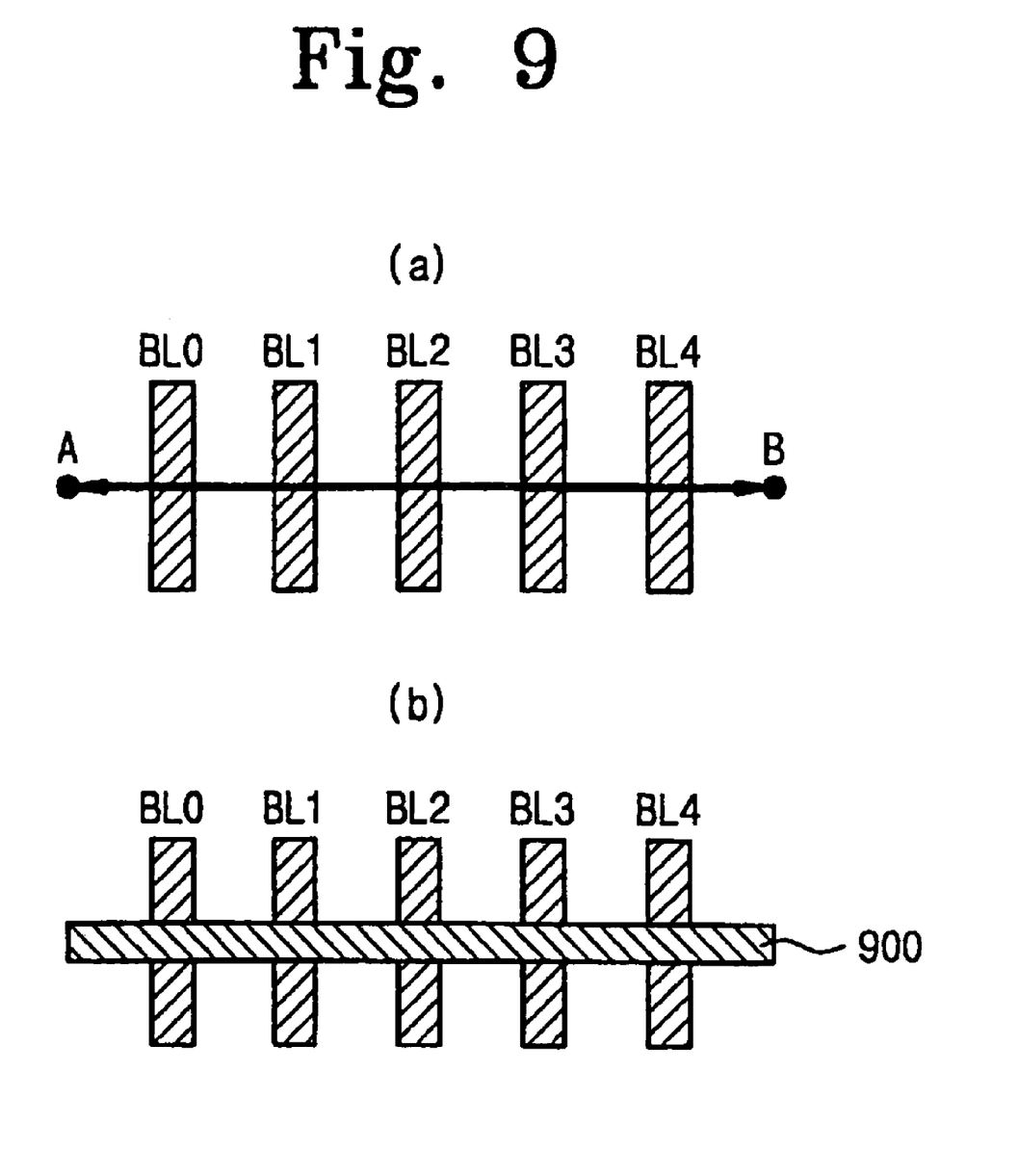
FIG. 9A is a view illustrating bit lines and a transmitting point and a receiving point of a signal connected by a line that intersects the bit lines in an example embodiment.
FIG. 9B is a view illustrating an example embodiment.

An example embodiment will be described with reference to FIGS. 9A and 9B. In an example embodiment, a transmitting point A and a receiving point B of a signal may be located as illustrated in FIG. 9A. A line 900 between the transmitting point A and the receiving point B may be at right angles to each of bit lines BL0~BL4, as illustrated in FIG. 9B. Similar to other example embodiments, coupling capacitances between the line 900 and the bit lines BL0~BL4 may be equalized, and the read characteristic may not be affected by the coupling capacitances.

As described above, when a line intersecting a memory cell is formed according to example embodiments, load due to coupling capacitances between the line and bit lines may be equalized. Therefore, effect on the read characteristic or the like may be reduced or minimized.

Example embodiments are exemplarily described, but are not limited thereto and various embodiments may be performed.

According to example embodiments, a line region may be effectively utilized. That is, a peripheral region may be reduced. Additionally, when the number of signal lines increases, line congestion may be easily resolved, and signal delay may be decreased by reducing a length of a signal line. Effect on the read characteristic may be reduced or minimized by equalizing load of coupling capacitances between a line intersecting a memory and bit lines.

The above-disclosed subject matter is to be considered illustrative, and not restrictive, and the appended claims are intended to cover all such modifications, enhancements, and other example embodiments, which fall within the true spirit and scope of the appended claims. Thus, to the maximum extent allowed by law, the scope of the example embodiments is to be determined by the broadest permissible interpretation of the following claims and their equivalents, and shall not be restricted or limited by the foregoing detailed description.

What is claimed is:

1. A semiconductor memory device, comprising:
   a memory cell array defining a memory cell region, including a plurality of word lines, a plurality of bit lines, and a plurality of memory cells arranged at intersections of the plurality of word lines and the plurality of bit lines in a matrix form; and
   a line, crossing the memory cell region, to connect first and second peripheral circuits, disposed in a peripheral region, to each other, wherein a coupling capacitance between the line and each of the plurality of bit lines is equalized; wherein
   the line includes a plurality of bent portions at each of the plurality of bit lines.

2. The semiconductor memory device of claim 1, wherein the line includes areas where the line and the plurality of bit lines extend parallel to each other are equal in dimension at each bit line.

3. The semiconductor memory device of claim 2, wherein a total number of the plurality of bent portions is greater than an integer multiple of a total number of the plurality of bit lines.

4. The semiconductor memory device of claim 1, wherein the line includes areas where the line and the plurality of bit lines overlap each other are equal in dimension at each bit line.

5. The semiconductor memory device of claim 4, wherein a total number of the plurality of bent portions is greater than an integer multiple of a total number of the plurality of bit lines.

6. The semiconductor memory device of claim 5, wherein the line extends perpendicular to each of the plurality of bit lines.

7. The semiconductor memory device of claim 1, wherein the line extends linearly between the first and second peripheral circuits in the memory cell region.

8. A method of forming a semiconductor memory device, comprising:
   providing a memory cell array defining a memory cell region, including a plurality of word lines, a plurality of bit lines, and a plurality of memory cells arranged at intersections of the plurality of word lines and the plurality of bit lines in a matrix form; and
   forming a line, crossing the memory cell region, to connect first and second peripheral circuits, disposed in a peripheral region, to each other, wherein a coupling capacitance between the line and each of the plurality of bit lines equalized; is wherein
   forming the line includes forming a plurality of bent portions at each of the plurality of bit lines.

9. The method of claim 8, wherein forming the line includes areas where the line and the plurality of bit lines extend parallel to each other are equal in dimension at each bit line.

10. The method of claim 9, wherein a total number of the plurality of bent portions is greater than an integer multiple of a total number of the plurality of bit lines.

11. The method of claim 8, wherein forming the line includes areas where the line and the plurality of bit lines overlap each other are equal in dimension at each bit line.

12. The method of claim 11, wherein a total number of the plurality of bent portions is greater than an integer multiple of a total number of the plurality of bit lines.

13. The method of claim 8, wherein the line extends linearly between the first and second peripheral circuits in the memory cell region.

14. The method of claim 13, wherein the line extends perpendicular to each of the plurality of bit lines.

* * * * *